(12) United States Patent
Hueting et al.

(10) Patent No.: US 7,696,599 B2
(45) Date of Patent: Apr. 13, 2010

(54) TRENCH MOSFET

(75) Inventors: Raymond J. E. Hueting, Hengelo (NL); Erwin A. Hijzen, Blanden (BE)

(73) Assignee: NXP B.V., Eindhoven (NL)

( * ) Notice: Subject to any disclaimer, the term of this patent is extended or adjusted under 35 U.S.C. 154(b) by 407 days.

(21) Appl. No.: 10/580,619

(22) PCT Filed: Nov. 26, 2004

(86) PCT No.: PCT/IB2004/052563
§ 371 (c)(1),
(2), (4) Date: May 24, 2006

(87) PCT Pub. No.: WO2005/053033
PCT Pub. Date: Jun. 9, 2005

(65) Prior Publication Data
US 2007/0108515 A1 May 17, 2007

(30) Foreign Application Priority Data
Nov. 29, 2003 (GB) .................. 0327793.6

(51) Int. Cl.
*H01L 29/93* (2006.01)
*H01L 21/336* (2006.01)

(52) U.S. Cl. .............. 257/475; 257/476; 257/510; 257/596; 438/270; 438/271; 438/589

(58) Field of Classification Search .......... 257/475, 257/476, 510, 513, 596, E21.359, E29.133, 257/E29.338; 438/270, 271, 589
See application file for complete search history.

(56) References Cited

U.S. PATENT DOCUMENTS

| | | | | |
|---|---|---|---|---|
| 5,132,753 A * | 7/1992 | Chang et al. | ............... | 257/655 |
| 5,612,567 A * | 3/1997 | Baliga | ............... | 257/475 |
| 5,637,898 A * | 6/1997 | Baliga | ............... | 257/330 |
| 5,981,996 A * | 11/1999 | Fujishima | ............... | 257/335 |
| 6,191,447 B1 * | 2/2001 | Baliga | ............... | 257/330 |
| 6,198,127 B1 * | 3/2001 | Kocon | ............... | 257/328 |
| 6,365,462 B2 * | 4/2002 | Baliga | ............... | 438/270 |
| 6,433,385 B1 * | 8/2002 | Kocon et al. | ............... | 257/328 |
| 6,541,817 B1 * | 4/2003 | Hurkx et al. | ............... | 257/330 |
| 2001/0000919 A1 * | 5/2001 | Kocon | ............... | 257/330 |

* cited by examiner

*Primary Examiner*—Howard Weiss
*Assistant Examiner*—Steven H Rao

(57) ABSTRACT

A trench MOSFET with drain (8), drift region (10) body (12) and source (14). In order to improve the figure of merit for use of the MOSFET as control and sync FETs, the trench (20) is partially filled with dielectric (24) adjacent to the drift region (10) and a graded doping profile is used in the drift region (10).

14 Claims, 2 Drawing Sheets

TRENCH MOSFET

The invention relates to a trench MOSFET (metal oxide semiconductor field effect transistor), and particularly but not exclusively to a trench MOSFET structure suitable for use as control and sync FETs.

Low-voltage trench MOSFETs are commonly used, for example in voltage regulator modules (VRMs) in power supplies for electronic equipment such as personal computers. Commonly, a pair of MOSFETs are used, known as a control FET and a Sync FET. The ideal characteristics of these FETs differ slightly. For the Sync FET the conduction power loss should be as low as possible. Since the conduction power loss is proportional to the specific on-resistance ($R_{ds,on}$) this parameter should be reduced. For the control FET on the other hand the switching loss should be minimised, which is proportional to the gate-drain charge density ($Q_{gd}$).

A figure of merit (FOM) has been defined as the multiple of $R_{ds,on}$ and $Q_{gd}$ to provide an indication of how suitable a transistor is in for use in VRMs. Note that the smaller the FOM the better. There is a need for structures that provide an improved figure of merit.

There is a drive to reduce the dimensions of trench MOSFETs, as for transistors generally. In the context of the devices considered here, the main benefit of this is to reduce the active area and so reduce $R_{ds,on}$. Such reduced size trench MOSFETs can be made, for example, using deep ultra-violet lithography.

However, this reduction in size is not necessarily attractive for the control FET since in a conventional structure the gate drain charge density $Q_{gd}$ increases drastically with reduced size. Thus, simply reducing the size of the structure does not give improvements as large as might be expected.

There is thus a need for an improved structure to give improved properties of FETs for VRMs.

According to the invention there is provided an insulated gate field effect transistor including: a source region of first conductivity type; a body region of second conductivity type opposite to the first conductivity type adjacent to the source region; a drift region of exclusively the first conductivity type adjacent to the body region; a drain region of first conductivity type adjacent to the drift region, so that body and drift regions are arranged between the source and drain regions, the drain region being of higher doping density than the drift region; and insulated trenches extending from the source region through the body region and into the drift region, each trench having sidewalls, and including insulator on the sidewalls, and a conductive gate electrode, wherein the base of each trench is filled with an insulator plug adjacent to substantially all of the length of the drift region between the body region and the drain region, and the respective gate electrode is provided in the trench over the plug adjacent to the source and body regions.

The invention uses the reduced surface field (RESURF) effect but unlike conventional RESURF transistors the RESURF is non-optimal in that the trench adjacent the drift region is filled with insulator, not gate electrode. Further, unlike some devices in which the drift region has stripes of both conductivity types to obtain a significant reduced surface field (RESURF) effect, the invention uses a drift region of single conductivity type.

In spite of the highly non-optimal RESURF effect achieved in the present invention the device can nevertheless achieve a reduced $R_{ds,on}$ for the same breakdown voltage compared with conventional trench MOSFETs. The drift doping concentration may be raised compared to a conventional FET, which can contribute to $Q_{gd}$ but this may be compensated for by the thick dielectric between gate and drain.

The device achieves this result in a way that is much simpler to manufacture than devices using doping of both n- and p-type in the drift region.

The plug may be a dielectric filler filling the trench between the insulator on the sidewalls adjacent to the drain. Alternatively, the plug may fill the entire base of the trench, and sidewall insulator provided only above the plug to insulate the gate electrode from the body and source regions.

Preferably, the doping concentration in the drift region is non-uniform, further preferably linearly graded, and preferably the doping concentration is higher adjacent to the drain region than adjacent to the body region. The $Q_{gd}$ value is determined to a significant extent by the depletion charge and this is addressed using the graded doping profile, which achieves an improvement in $Q_{gd}$.

Calculations (presented below) show that the invention can achieve a significant improvement in the $R_{ds,on}$ value with some improvement in $Q_{gd}$. Thus, the figure of merit of the device according to the invention is improved significantly over prior art devices.

In embodiments, the body doping concentration is in the range 0.5 to $3 \times 10^{17}$ cm$^{-3}$, and the drift doping concentration is in the range $10^{15}$ to $2 \times 10^{17}$ cm$^{-3}$. Specific values may be selected to provide an appropriate trade-off between $R_{ds,on}$ and $Q_{gd}$.

The invention is of particular application to a vertical trench MOSFET, i.e. a MOSFET having a semiconductor body having opposed first and second major surfaces, wherein the source region is at the first major surface over the body region, the body region is over the drift region and the drift region is over the drain region, and the trench extends from the first major surface towards the second major surface through the source, body and drift regions.

Note that in this specification the term "over" is used for the direction towards the first major surface and "under" for the direction towards the second major surface without any orientation in space of the MOSFET being intended.

In particular, the transistor may have a plurality of cells, each cell having a source region at the centre of the cell surrounded by the insulated trench.

The cells may have a hexagonal geometry, or a rotated square geometry.

Alternatively, the cells may be stripes arranged laterally across the first major surface with alternating sources and trenches.

The cell pitch may typically be in the range 0.2 to 0.7 micron, for breakdown voltages up to 30V. For higher breakdown voltages, the trench may be deeper than otherwise, and this can lead to a requirement for an increased cell pitch, for example up to 1.5 microns or even higher for higher breakdown voltages still.

The trench may have gate oxide on the sidewalls and the base of the trench adjacent to the drift region may be filled with filler oxide between the gate oxide on the sidewalls. Alternatively, nitride or oxynitride can be used as the filler.

Embodiments of the invention will now be described, purely by way of example, with reference to the accompanying drawings in which.

Note that the drawings are schematic and not to scale. Like reference numerals are used for the same or similar features in different figures.

Figure 1:
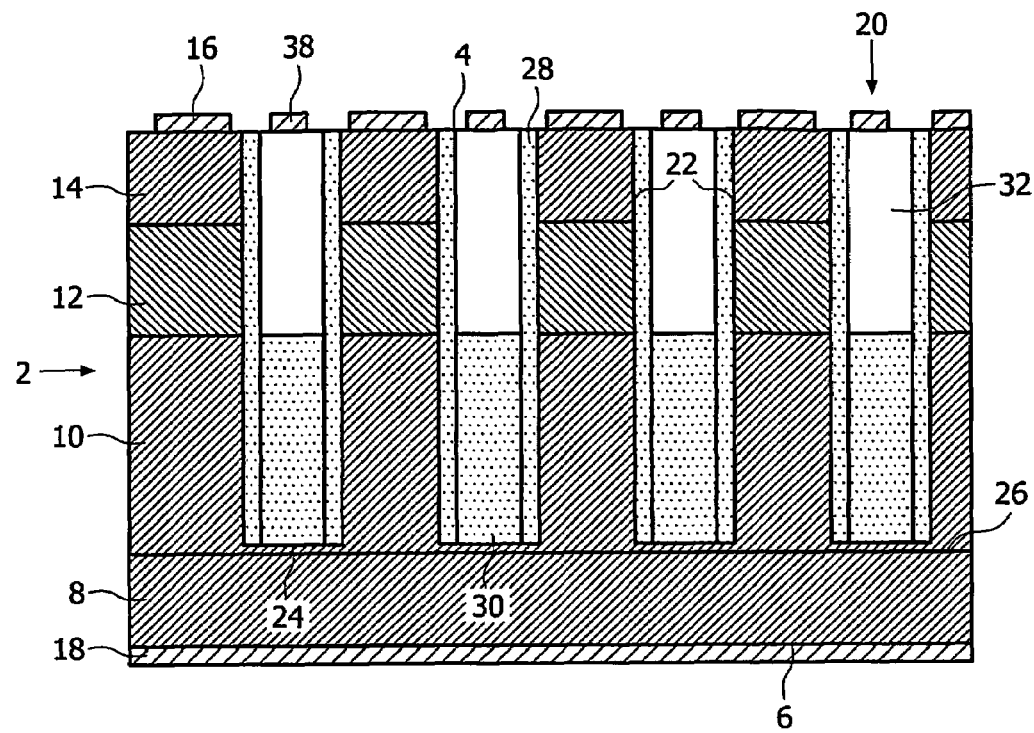
FIG. 1 shows a cross-sectional side view of a MOSFET according to a first embodiment of the invention.

FIG. 1 shows a cross-section through a semiconductor device according to a first embodiment of the invention. A silicon semiconductor body 2 has opposed first 4 and second 6 major surfaces. An n+ drain region 8 adjoins the second major surface. An n− drift region 10 is provided on top of the drain region 8, a p body region 12 on top of the drain and an n+ source region 14 on top of the body region 12. A source contact 16 is provided on the first major surface 4 to connect to the source region 14 and a drain contact 18 is provided on the second major surface 6 to connect to the drain region.

A trench 20 extends from the first major surface 4 through the source region 14, the body region 12 and the drift region 10, having sidewalls 22 and a base 24 close to the drain region-drift region interface 26. Gate oxide 28 is provided on the sidewalls 22. The base of the trench 20 is filled with oxide dielectric filler 30 adjacent to the drift region 10. Above the dielectric filler 30 is provided a polysilicon gate 32 adjacent to the source region 14 and body region 12. A gate contact 38 connects to the gate 32.

Figure 2:
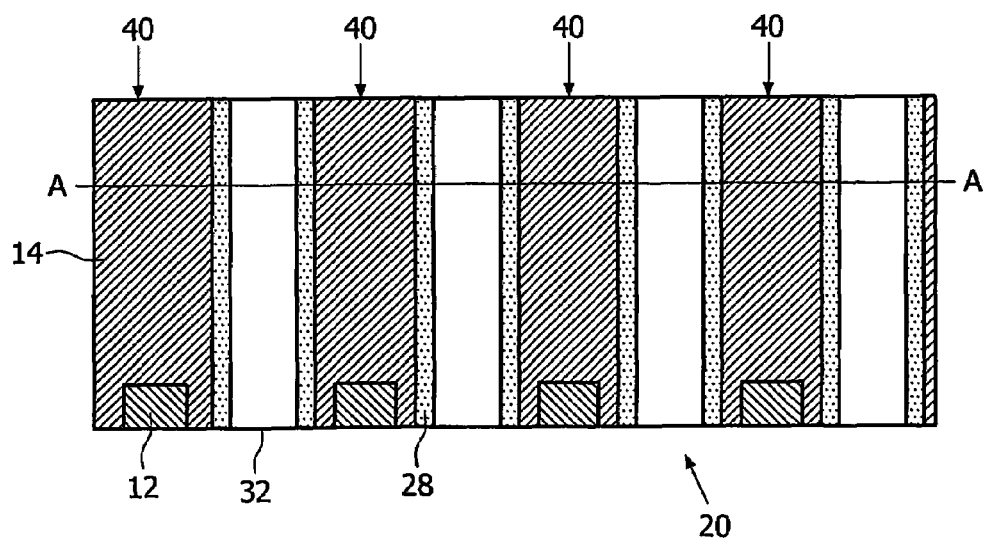
FIG. 2 shows a top view of the embodiment of FIG. 1.

As illustrated in FIG. 2, in the specific example, a plurality of cells 40 extend across the first major surface to define a plurality of stripes in which the source region 14 and trench 20 alternate. The cell pitch is 0.5 micron, and the trench is 1.2 microns deep and 0.25 micron wide. Line A-A indicates where the section of FIG. 1 is taken. As the skilled person will appreciate, these size values can be changed as required.

The p-type body region 12 extends to a depth of 0.6 micron, and is exposed at the first major surface 4 so that it can be connected to the source contact 16 at a location spaced away from line A-A. For clarity, the source contact 16 is not shown in FIG. 2.

Figure 3:
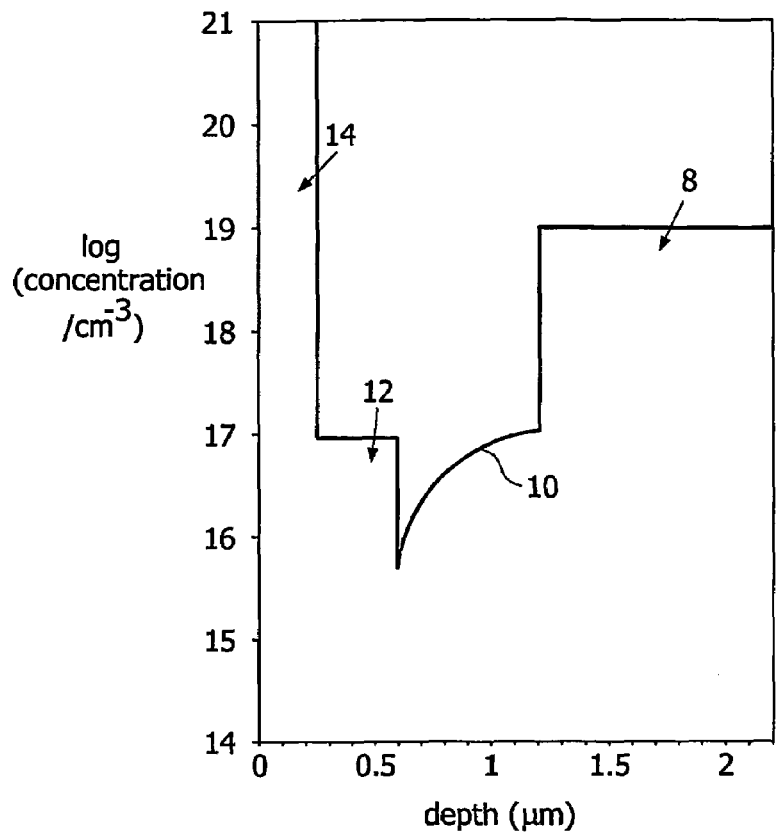
FIG. 3 shows the doping profile of a MOSFET according to the first embodiment.

The doping profile is shown as a function of depth in FIG. 3. The drift region 10 doping concentration varies from $5 \times 10^{15}$ cm$^{-3}$ at the junction of the body 12 and drift region 10 and increases linearly to a value of approximately $10^{17}$ cm$^{-3}$ at the drift-drain interface 26. The drain region is doped $10^{19}$ cm$^{-3}$ n-type, the body region $10^{17}$ cm$^{-3}$ p-type and the source is heavily doped $10^{21}$ cm$^{-3}$ n-type.

In this specific example the breakdown voltage BV has been calculated to be 25V, with the breakdown occurring near the p-body region 12/drift region 10 junction. A value of $R_{ds,on}$ if 1.1 mΩ·mm$^2$ excluding the substrate resistance has been calculated for a gate-source voltage of 10V and $Q_{gd}$ has been calculated to be 2.2 nC/mm$^2$ for a drain-source voltage of 12V. This gives a figure of merit of 2.4 mΩ·nC. This compares to 6.3 mΩ·nC for a conventional trench MOSFET with a 200 nm thick trench base oxide, the same pitch, trench width and breakdown voltage as the example but with a constant drift doping density.

The invention can thus give very significantly improved figures of merit.

Figure 4:
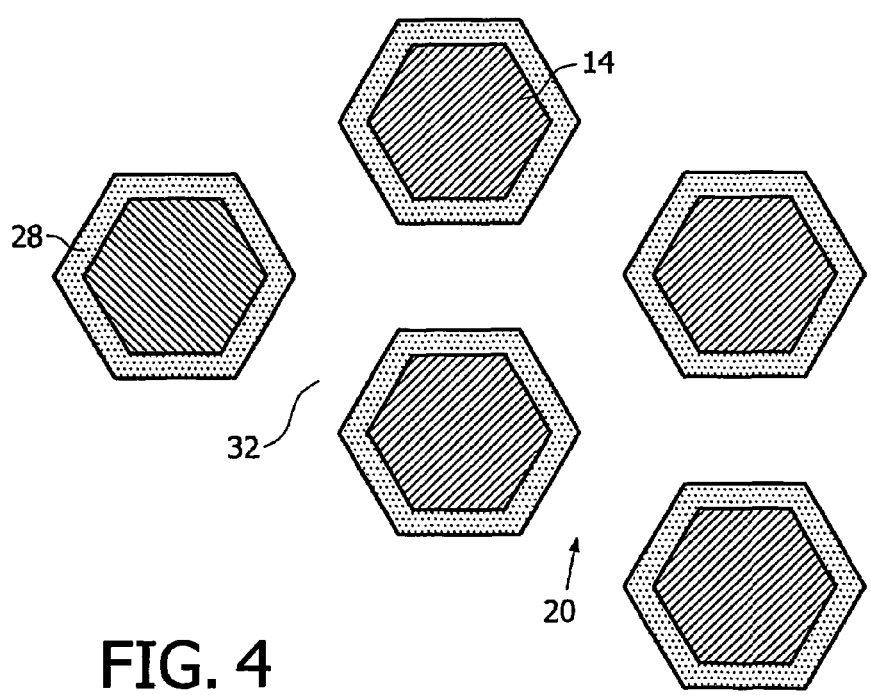
FIG. 4 shows the top view of a MOSFET according to a second embodiment of the invention.

In a second embodiment, instead of a stripe geometry a cell geometry is used, as shown in FIG. 4 which shows a hexagonal geometry. The centre of each hexagonal cell includes the stack of source 14, body 12 and drift 10 regions, and an interconnecting matrix of trenched gates 32 surrounds the cells.

Calculations have been carried out and give a value of $R_{sd,on}$ of 1.4 mΩ·mm$^2$ excluding the substrate resistance for a gate-source voltage of 10V and a $Q_{gd}$ of 1.6 nC/mm$^2$ for a drain-source voltage of 12V. This gives a figure of merit of 2.2 mΩ·nC. This is even better than the embodiment of FIG. 1. The p-type body 12 doping density may be increased slightly if a higher threshold voltage is required. Alternatively, p-type instead of n-type polysilicon can be used for the gate conductive layer which also increases the threshold voltage.

The figure of merit of a recently published LDMOS structure (Ludikhuize A W, ISPSD p 301-304, 2002) is 22 mΩ·nC. This is for a larger cell size but, even scaling to a 0.5 micron pitch still gives rise to a $Q_{gd}$ of 6.6 nC/mm$^2$. Thus the invention provides much better results than this published value.

From reading the present disclosure, other variations and modifications will be apparent to persons skilled in the art. Such variations and modifications may involve equivalent and other features which are already known in the design, manufacture and use of semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

For example, the p-type and n-type layers may be reversed.

Instead of a silicon body, the invention may also use other semiconductor materials, including for example III-V materials.

For example, the oxide dielectric in the trench can be replaced with nitride or oxynitride. This should increase $Q_{gd}$ but decrease $R_{ds,on}$. A low-k material may be used which should have the opposite effect.

Instead of a polysilicon gate other materials can be used. In particular, a silicide gate can be used.

Also, although the specific embodiment uses separate gate oxide and trench filler it is also possible to implement the invention using a single dielectric in the trench.

A 1 of n principle may be used. In this arrangement, an additional source field plate may be provided in 1 out of every n trenches.

The invention may also be applied in lateral trench MOSFETs.

The invention claimed is:

1. An insulated gate field effect transistor, comprising:
a source region of a first conductivity type;
a body region of a second conductivity type opposite to the first conductivity type adjacent to the source region;
a drift region of exclusively the first conductivity type adjacent to the body region;
a drain region of the first conductivity type adjacent to the drift region, so that body and drift regions are arranged between the source and drain regions, the drain region being of higher doping density than the drift region, and wherein the region between the body region and the drain region is made up of exclusively the drift region of exclusively the first conductivity type; and
insulated trenches extending from the source region through the body region and into the drift region, each trench having sidewalls, and including an insulator on the sidewalls, and a conductive gate electrode between the insulating sidewall,
wherein the base of each trench is filled with an insulator plug adjacent to substantially all of the length of the drift region between the body region and drain region, and the respective gate electrode is provided in the trench over the plug adjacent to the source and body regions.

2. An insulated gate field effect transistor according to claim 1 wherein the doping concentration in the body region is in the range of about $0.5 \times 10^{17}$ cm$^{-3}$ to about $3 \times 10^{17}$ cm$^{-3}$, and the doping concentration in the drift region is in the range of about $0.5 \times 10^{15}$ cm$^{-3}$ to about $2 \times 10^{17}$ cm$^{-3}$.

3. An insulated gate field effect transistor according to claim 1 wherein the plug is of dielectric filler filling the trench between the insulator on the sidewalls adjacent to the drain region.

4. An insulated gate field effect transistor according to claim 1 having a semiconductor body having opposed first second major surfaces, wherein the source region is at the first major surface over the body region, the body region is over the drift region and the drift region is over the drain region, and the trench extends from the first major surface towards the second major surface through the source, body and drift regions.

5. An insulated gate field effect transistor according to claim 4 having a plurality of cells, each cell having a source region at centre of the cell surrounded by the insulated trench.

6. An insulated gate field effect transistor according to claim 5 wherein the cells have a hexagonal geometry.

7. An insulated gate field effect transistor according to claim 5 wherein the trench has gate oxide on the sidewalls, and the trench adjacent to the drift region is filled with filler oxide between the gate oxide on the sidewalls on either side of the trench.

8. An insulated gate field effect transistor according to claim 4 having a plurality of cells, arranged as stripes across the first major surface with alternating trenches and source regions.

9. An insulated gate field effect transistor according to claim 5 wherein the cell pitch is in the range of about 0.2 microns to about 0.7 microns.

10. An insulated gate field effect transistor according to claim 1 wherein the doping concentration in the drift region is non-uniform.

11. An insulated gate field effect transistor according to claim 10 wherein the non-uniform doping concentration in the drift region comprises a higher doping concentration adjacent to the drain region and a lower doping concentration adjacent to the body region.

12. An insulated gate field effect transistor according to claim 11 wherein the non-uniform doping concentration in the drift region is linearly graded from the higher doping concentration adjacent to the drain region to the lower doping concentration adjacent to the body region.

13. An insulated gate field effect transistor according to claim 10 wherein the doping concentration in the body region is in the range of about $0.5 \times 10^{17}$ cm$^{-3}$ to about $3 \times 10^{17}$ cm$^{-3}$, and the doping concentration in the drift region is in the range of about $1 \times 10^{15}$ cm$^{-3}$ to about $2 \times 10$ cm$^{-3}$.

14. An insulated gate field effect transistor according to claim 1 wherein the trench extends through the source region, the body region, and the drift region toward the drain region, without entering the drain region.

\* \* \* \* \*